United States Patent
Zennamo, Jr.

(10) Patent No.: US 6,842,086 B1
(45) Date of Patent: Jan. 11, 2005

(54) TWO-POLE NOTCH FILTER

(75) Inventor: Joseph A. Zennamo, Jr., Skaneateles, NY (US)

(73) Assignee: Eagle Comtronics, Inc., Clay, NY (US)

( * ) Notice: Subject to any disclaimer, the term of this patent is extended or adjusted under 35 U.S.C. 154(b) by 0 days.

(21) Appl. No.: 09/378,332

(22) Filed: Aug. 20, 1999

(51) Int. Cl.$^7$ ................................................ H03H 7/01
(52) U.S. Cl. ........................................ 333/175; 333/185
(58) Field of Search ............................... 333/172, 174, 333/175, 176, 185

(56) References Cited

U.S. PATENT DOCUMENTS

| | | | |
|---|---|---|---|
| 4,451,803 A | | 5/1984 | Holdsworth et al. .......... 333/12 |
| 4,586,007 A | | 4/1986 | Ciszek ........................ 333/175 |
| 4,748,667 A | * | 5/1988 | Farmer et al. .............. 380/208 |
| 4,795,990 A | | 1/1989 | Ishikawa et al. ........... 333/176 |
| 4,901,043 A | * | 2/1990 | Palinkas ..................... 333/175 |
| 4,939,779 A | | 7/1990 | Hitchcock ................... 380/208 |
| 5,068,893 A | * | 11/1991 | West et al. ................. 380/208 |
| 5,157,362 A | | 10/1992 | Zelenz ........................ 333/175 |
| 5,168,251 A | * | 12/1992 | Zennamo et al. ........... 333/175 |
| 5,202,656 A | * | 4/1993 | Clark et al. ................. 333/174 |
| 5,392,011 A | | 2/1995 | Li ............................... 333/174 |
| 5,662,494 A | | 9/1997 | Zennamo .................... 439/589 |
| 5,745,838 A | | 4/1998 | Tresness .................... 725/128 |

\* cited by examiner

*Primary Examiner*—Robert Pascal
*Assistant Examiner*—Dean Takaoka
(74) *Attorney, Agent, or Firm*—Burr & Brown

(57) ABSTRACT

A tunable top-pole passive notch circuit for attenuating select frequencies of a multi-frequency CATV signal. The circuit includes an input for receiving a multi-frequency CATV signal, and an output for transmitting a portion of the multi-frequency CATV signal, A filter network for attenuating a band of frequencies from the multi-frequency signal is distributed been the input and the output. The filter network includes three parallel branches A, B, and C, each being arranged in series connection between the input and the output. Branch A includes an inductor. Branch B includes an adjustable parallel tank circuit Branch C includes a second adjustable electrical resonator. The filter has frequency response characteristics that are more stable than prior art two-pole notch filters, and similar to the response characteristics of more complex three pole or four pole notch filters. The two-pole tunable notch filter circuit provides a passband response to 1 GHz.

37 Claims, 16 Drawing Sheets

TWO-POLE NOTCH FILTER

The present invention relates to the art of electronic notch filters, and particularly to tunable passive notch filters suitable for use in attenuating one or more frequency components responsible for scrambling signals present in a signal of a single television channel. Such scrambling signals are typically included in a television channel signal to prevent intelligible reception of the video and/or audio portion thereof. Tuned notch filters are used to remove the scrambling signal from the television channel signal to thereby allow reception of the television channel signal (i.e., positive trapping). Such filters may also be utilized for negative trapping to reject certain frequencies within a television channel bandwidth to prevent reception of information through that channel.

BACKGROUND OF THE INVENTION

Electronic circuits are often used to attenuate a selected band of frequencies while passing a larger band of frequencies. Filters employed for this purpose are commonly known as notch filters. A notch filter can best be defined as a filter having a single rejection band extending from a finite lower cutoff frequency (greater than zero) to a finite upper cutoff frequency. Frequencies within the rejection band are eliminated or attenuated, while frequencies outside the rejection band are retained.

Such notch filters are widely used in conjunction with cable television systems. Within a cable television system a broad range of carrier frequencies are provided, with each frequency corresponding to a service for which the subscriber pays. If a subscriber does not pay for selected services, it is well-known that placement of a notch filter in the coaxial line leading to the subscriber's facility will remove the frequencies corresponding to those services. If several frequencies need to be removed, the filters may be placed in series, or a single filter may be arranged to remove more than one frequency.

Cable television engineers have conceived a wide variety of notch filter networks or circuit designs in an attempt to satisfy the constantly changing demands for such devices. In some cable television systems, such filters are installed outside a customer's home or place of business, often on a pole or pad outside the home or business, to permit cable company personnel to have easy access to the devices. Since no source of energy is available, it is necessary that the filter is constructed using purely passive circuit components (i.e., resistors, capacitors, and inductors). At the same time, filters are exposed to the full range of variations in ambient temperatures. Variations in ambient temperature cause the values of the passive circuit components to change, which often results in de-tuning of the filter by causing shifting of the center frequency or otherwise adversely affecting the stability of the filter device. In order to ensure that the filter operates correctly, it is necessary that the shape of the frequency response produced by the filter remain relatively constant. Not only must such filter maintain tuning in the neighborhood of a desired center frequency; the filter must also retain the shape of the notch in terms of width and depth. Drifting of the center frequency could prevent reception of the desired frequencies of the signal by unnecessarily attenuating immediately adjacent frequency bands or channels. At the same time, the very portion of the spectrum which is sought to be attenuated might be allowed to pass. Thus, stability of these filters is highly desirable.

Since the advent of notch filters, cable television engineers have been faced with the conflicting goals of simplicity and performance. As a general rule, it has conventionally been accepted that stability is inversely proportional to the simplicity of the circuit. To achieve the desired performance characteristics it has been necessary to utilize complex notch filter-circuits having several poles which necessarily increased the number of components and overall size of the filter. For example, a four-pole device is shown in FIG. 4. Although the circuit shown in FIG. 4 has great stability for a passive notch filter design, it suffers from the undesirable tradeoff that a large number of components are required. FIG. 3 shows a conventional three-pole notch filter that provides good stability, but which also employs ten parts. Thus, it is clear that in each of the above designs a large number of components is necessary in order to stabilize the center frequency while maintaining the desired notch width and depth.

For quite some time, cable television engineers have unsuccessfully attempted to reduce the number of components by using a simpler two-pole notch filter. For example, the assignee of the present application has utilized the two-pole notch filter shown in FIG. 2. However, as shown in FIG. 5a, the "tuning window" or notch characteristic associated with this particular two-pole design was extremely narrow. Thus, the attenuation provided by the filter was insufficient to achieve the bandwidth necessary to ensure stable performance of the filter.

Known two-pole filters such as the one shown in FIG. 2 have insufficient stability to successfully function in cable or CATV applications. The prior art two-pole notch filter shown in FIG. 2 is very sensitive to environmental changes and susceptible of detuning over time due to its narrow range of optimum phase cancellation tuning and/or performance. A minor change in the frequency of either pole will cause significant bandwidth and attenuation performance changes of the filter and any system in which the filter is placed or serves. Even with significant component changes to increase the bandwidth, the prior art two-pole filter continues to be unstable and overly sensitive due to its narrow phase cancellation tuning/notch range.

In an effort to better improve the stability of the notch, the present assignee had previously cascaded two of these two-pole filters in series with each other (effectively providing the 4-pole filter shown in FIG. 4). It is well-known that the bandwidth and attenuation of the system will be doubled by cascading two such devices. The inventor found that adequate attenuation (−50 dB) could be achieved by cascading two two-pole devices. Although this practice greatly improved the stability of the filter, while providing the desired attenuation and bandwidth, this design also require the use of a relatively large number of components. This design also required the use of shielding between each two-pole section to prevent interfilter detuning. In turn, this increased the overall size and production cost of the filter. At the same time, cascading two of the two-pole filters resulted in a particularly wide notch characteristic in the vicinity of the center frequency. This is undesirable since it causes attenuation or even complete elimination of immediately adjacent residual side bands necessary for the reception of adjacent channels.

In view of the above-described problems, it is clear that the prior art notch filters often exhibit inadequate stability and/or inadequate notch sharpness, as in prior two-pole devices, or are of undesirably large size and high production cost, such as the present four-pole devices. Thus, a great need exists for a notch filter that will improve the stability and notch sharpness problems associated with known two-pole devices, while simultaneously reducing the size and production cost associated with known four-pole devices.

SUMMARY OF THE INVENTION

It is an object of the present invention to provide a new notch filter having two tunable poles, which overcomes the aforementioned shortcomings of the prior art.

It is a further object of the present invention to provide a novel notch filter with two tunable poles, which provides wider in-band notch characteristics, less sensitivity, and greater stability than previously known two-pole notch filter circuits.

It is still a further object of the present invention to provide a notch filter having two tunable poles, which exhibits an improved inband bandwidth characteristic without causing loss of adjacent channels by eliminating residual sidebands.

It is a further object of the present invention to provide a notch filter having two tunable poles, which may be quickly and economically constructed and precisely tuned to a desired notch center frequency, while stably maintaining tuning to that desired frequency regardless of environmental factors.

It is still a further object of the present invention to provide a notch filter having two tunable poles, which minimizes the physical size of the circuit by reducing the number of components necessary to construct the notch filter circuit.

It is a still further object of the present invention to provide a notch filter circuit having two tunable poles, which provides a passband response up to one GHz, and exhibits performance characteristics comparable to known notch filters having three or four poles, without the increased number of components and higher production costs typically associated with such known three- or four-pole notch filters.

The foregoing objects and others are provided by the advantageous system of the present invention which provides a tunable two-pole passive notch filter circuit for attenuating select frequencies of a multi-frequency CATV signal. The circuit includes an input for receiving a multi-frequency CATV signal, and an output for transmitting a portion of the multi-frequency CATV signal. A filter network for attenuating a band of frequencies from the multi-frequency signal is distributed between the input and the output. The filter network comprises three branches A, B, and C. Branch A and branch B are connected in parallel and are arranged in series connection between the input and output. Branch A comprises an inductor. Branch B comprises an adjustable tank circuit, and branch C comprises an adjustable electrical resonator. Branch B may optionally include a stabilizing inductor connected between the adjustable tank circuit and the output. Branch C may optionally include at least one of a first capacitor connected between the input and the adjustable electrical resonator, and a second capacitor connected between the adjustable electrical resonator and the output. The adjustable electrical resonator is preferably shunted between branch C and ground, and preferably comprises an LC parallel-resonant circuit. The adjustable tank circuit and the adjustable resonator should each preferably include either a variable inductor or a variable capacitor for adjusting the resonant frequency thereof to thereby adjust the poles of the circuit.

The two-pole notch filter design of the present invention offers excellent long tern stability in comparison with known two-pole notch filters. The present two-pole design also provides a wider inband bandwidth characteristic, while having decreased sensitivity in comparison with known two-pole notch filters. This two-pole notch filter design utilizes a minimum number of components to provide a unit that is physically smaller, less costly, and easier to mass produce than other notch filters.

BRIEF DESCRIPTION OF THE DRAWINGS

Further features and embodiments of the advantageous system of the present invention are described in the accompanying drawings, wherein:

FIG. 5$b$ is a graph showing the frequency response of a prior art notch filter of FIG. 2 compared with the frequency response of an advantageous two-pole tunable notch filter of the present invention;

FIG. 5$c$ is a graph showing the frequency response of the advantageous two-pole tunable notch filter of the present invention compared to the frequency response of a prior art three-pole notch filter; and FIG. 5$d$ is a graph showing the frequency response of the advantageous two-pole tunable notch filter of the present invention compared to the frequency response of a prior art four-pole notch filter.

DETAILED DESCRIPTION OF THE DRAWINGS

Figure 1A:
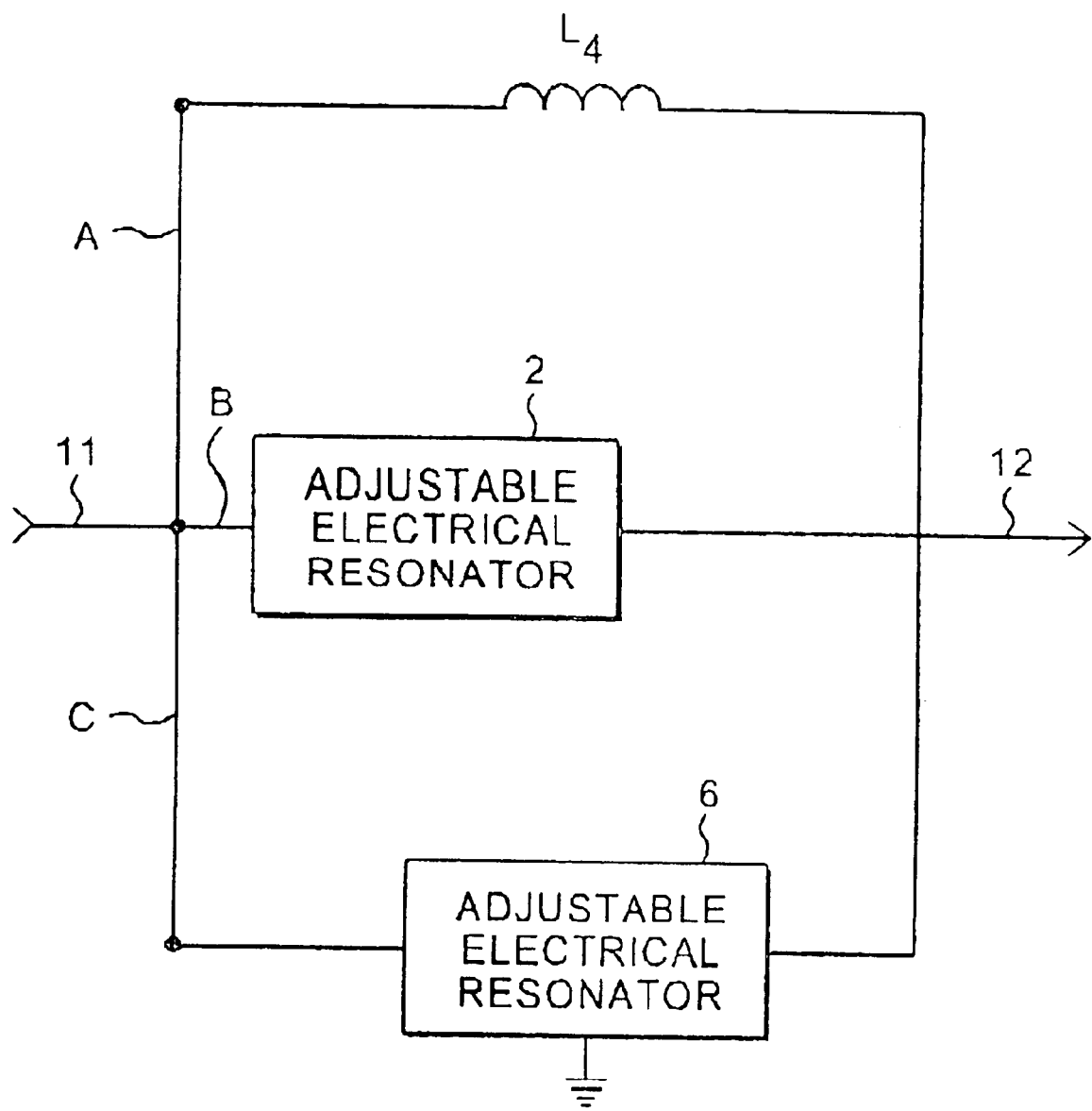
FIGS. 1$a$-1$i$ show schematic diagrams of nine embodiments of the two-pole notch filter circuit of the present invention.
Figure 1B:
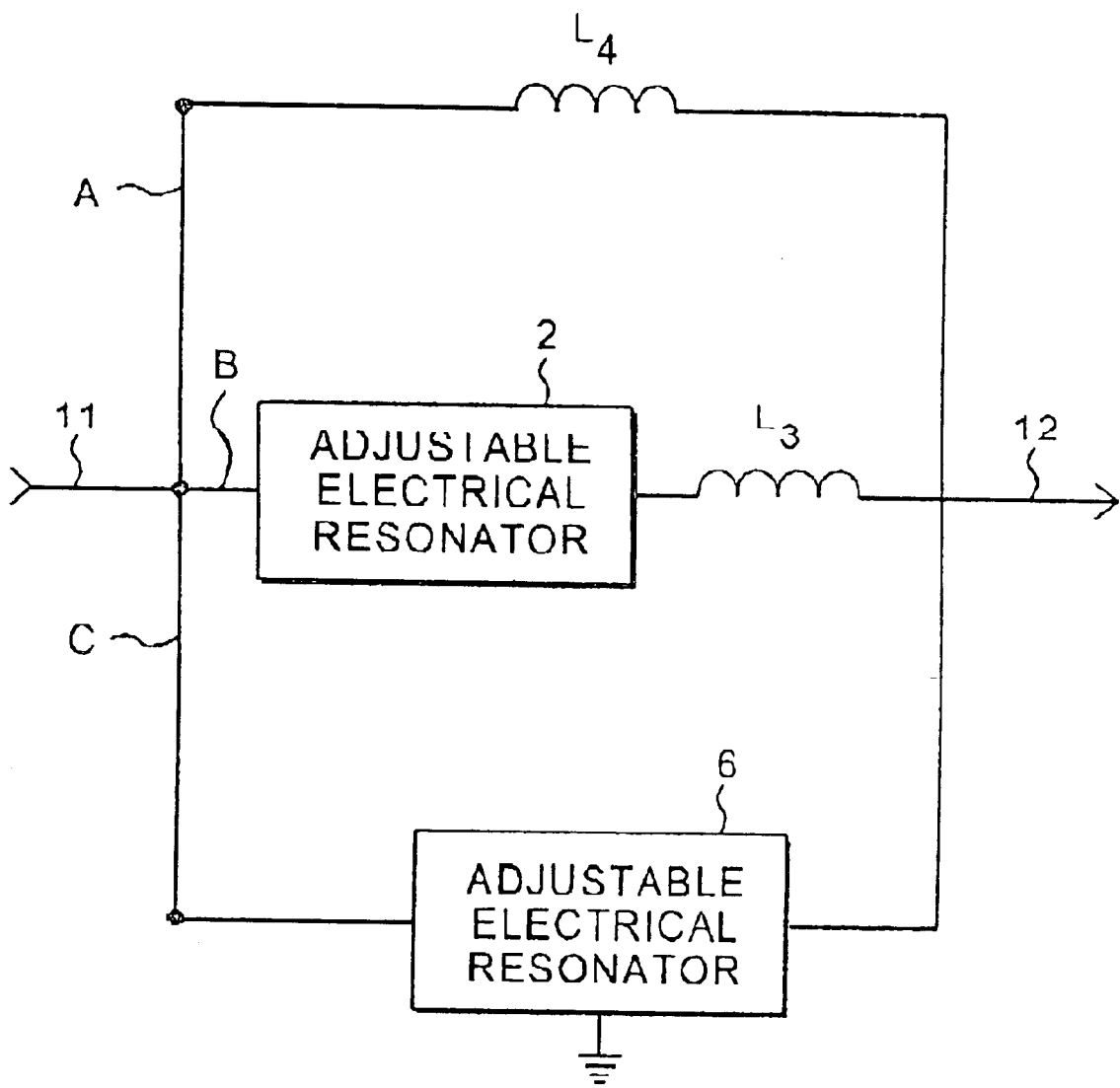
Figure 1C:
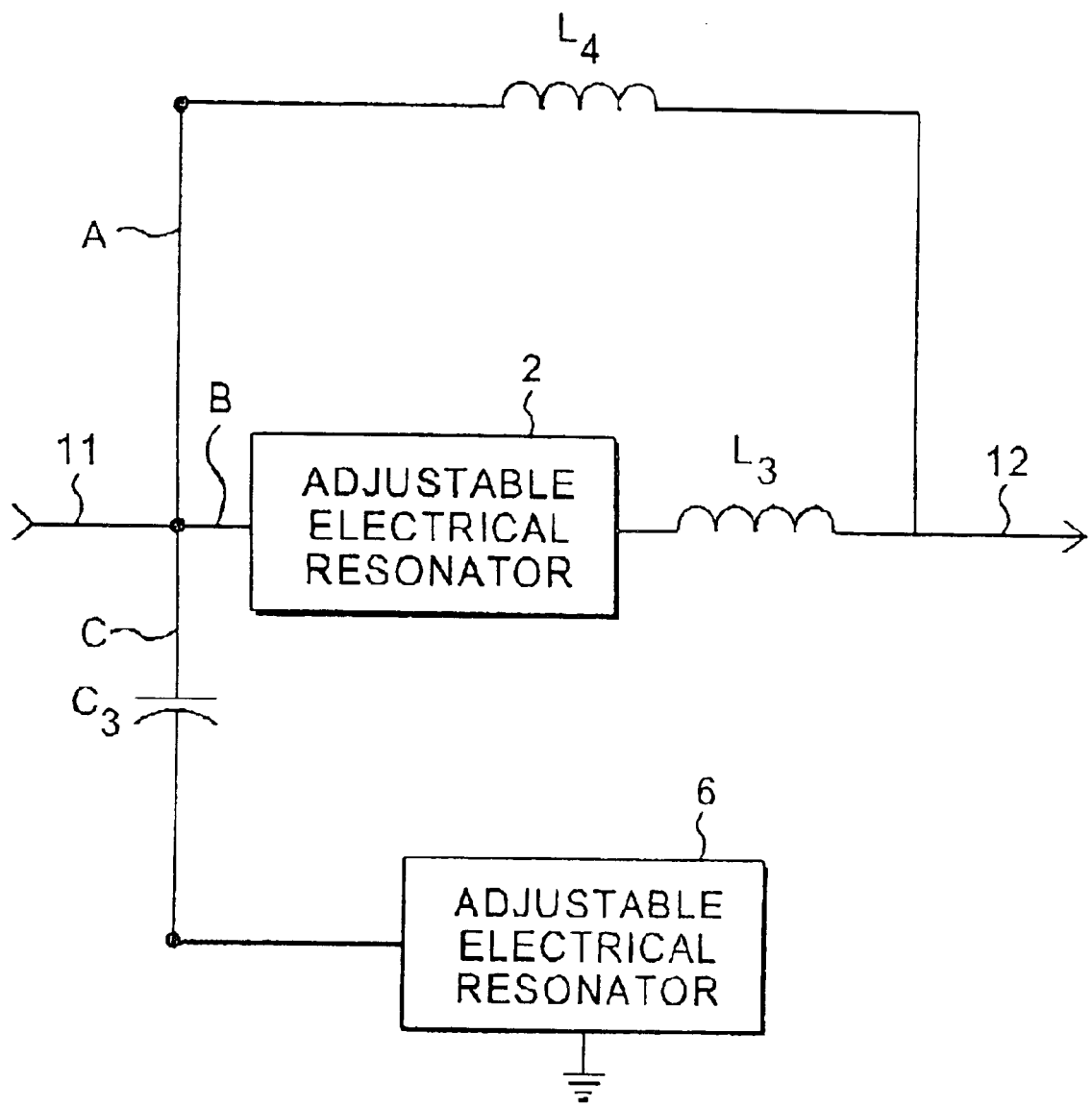
Figure 1D:
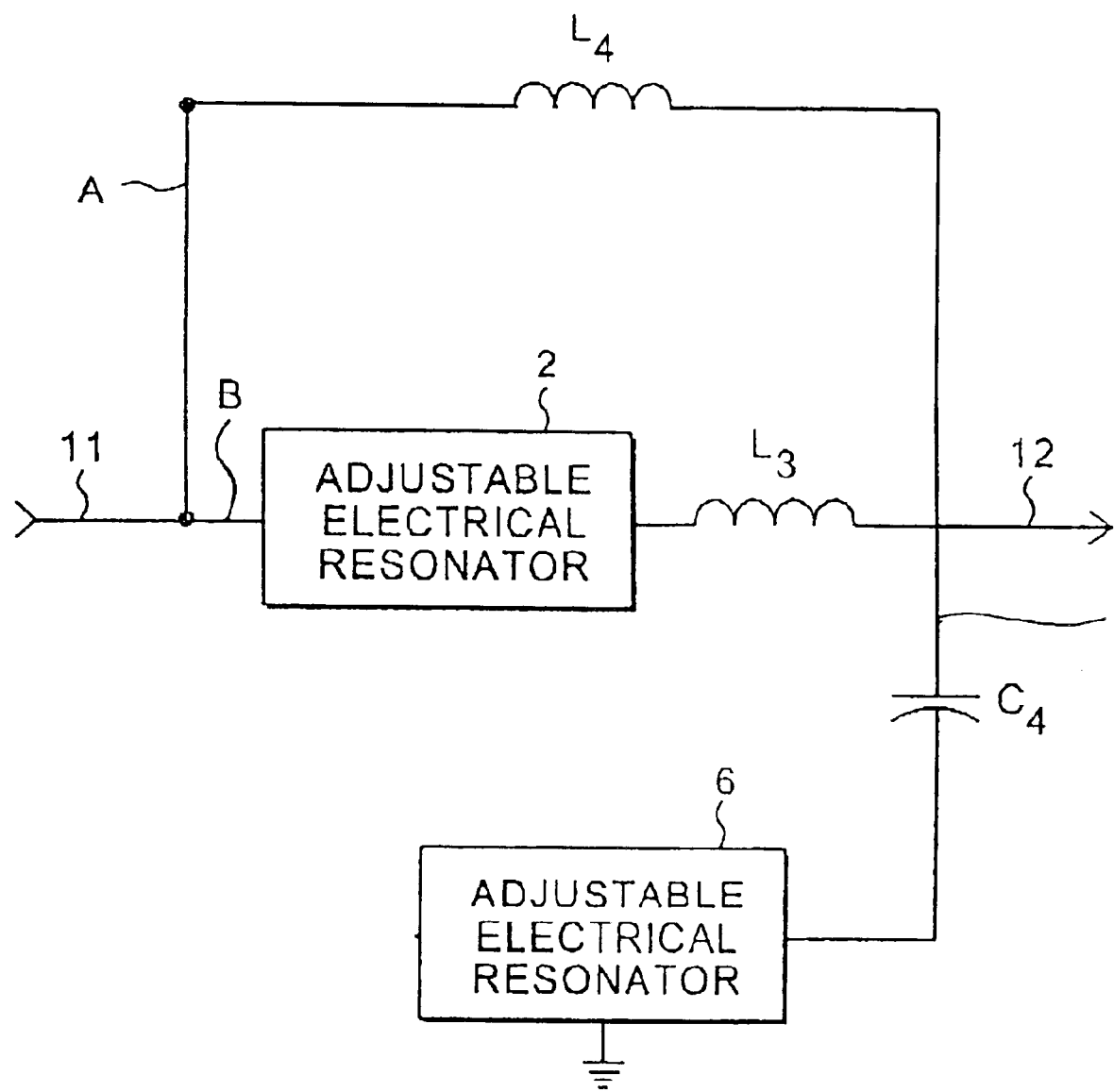
Figure 1E:
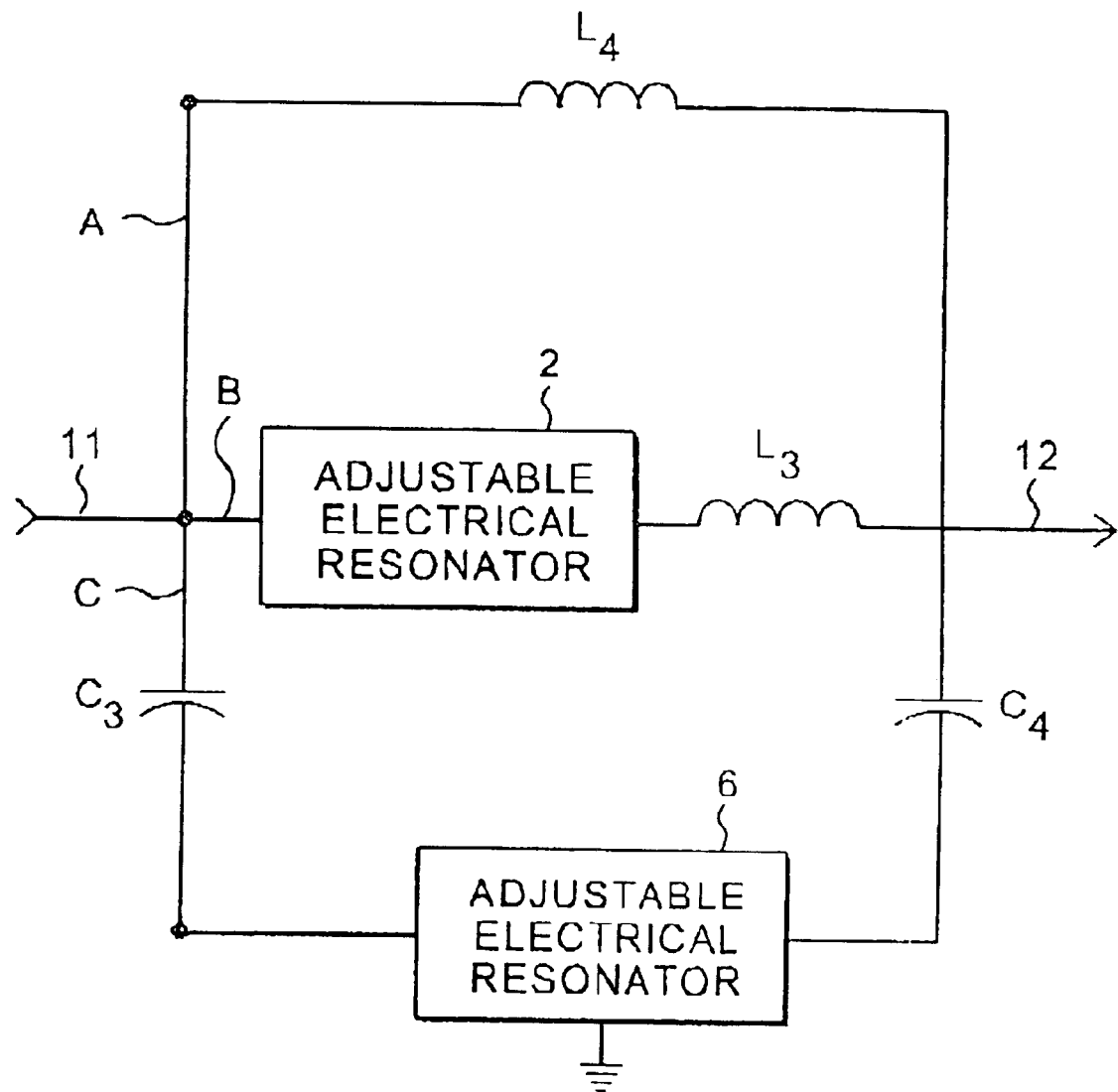

Referring first to FIG. 1$a$, a tunable two-pole passive notch filter circuit for attenuating select frequencies of a multi-frequency CATV signal will now be described in detail. As shown in FIG. 1$a$, the circuit includes an input 11 for receiving a multi-frequency CATV signal, and an output 12 for transmitting a portion of the multi-frequency CATV signal. FIGS. 1$a$ through 1$i$ show different embodiments of filter networks to be distributed between the input and the output. These filter networks are used for attenuating a particular band of frequencies present in the multi-frequency signal. Throughout this description any of the passive circuit components can be either fixed of variable unless otherwise specified.

In its most basic terms, the filter network comprises three branches shown as A, B, and C in the drawings. As shown in FIG. 1$h$, branches A and branch B are connected in parallel and are arranged in series connection between the input and output. Branch C is connected to at least one of the input 11 and the output 12. The particular order of these branches is not important, so long as the connective relationships between the input and output are maintained.

In each embodiment shown in FIGS. 1$a$ through 1$i$, Branch A comprises an inductor shown as L4.

As shown in FIGS. 1$a$ through 1$g$, Branch B comprises an adjustable tank circuit 2. Tank circuits are well known in the art and can be defined as parallel resonant circuits. As shown in FIGS. 1$h$ and 1$i$, the adjustable tank circuit preferably comprises an LC parallel-resonant circuit formed by placing variable inductor L1 in parallel with capacitor C1. It should also be recognized that electrical resonator 2 may interchangeably include either a variable inductor or a variable capacitor (or both) for adjusting the resonant frequency thereof. The important characteristic is adjustability of the resonant frequency. In the preferred embodiments shown in FIGS. 1b–1i, a stabilizing inductor L3 is connected between the adjustable tank circuit 2 and the output 12.

In conceiving the present invention, the inventor discovered that placement of variable inductor L1 in parallel with capacitor C1, both of which are in series with additional inductor L3, improves the frequency stability characteristics of the notch filter circuit of the present invention over the prior art circuits. The use of additional inductor L3 causes a phase shift across terminals 11 and 12 which increases the width of the notch and provides additional stability which is not exhibited by prior art two-pole notch filters. Unexpectedly, yet significantly, the additional inductor increases the phase cancellation tuning range which thereby reduces the sensitivity of each pole's frequency needed to achieve and maintain a notch and its desired characteristics.

Figure 1F:
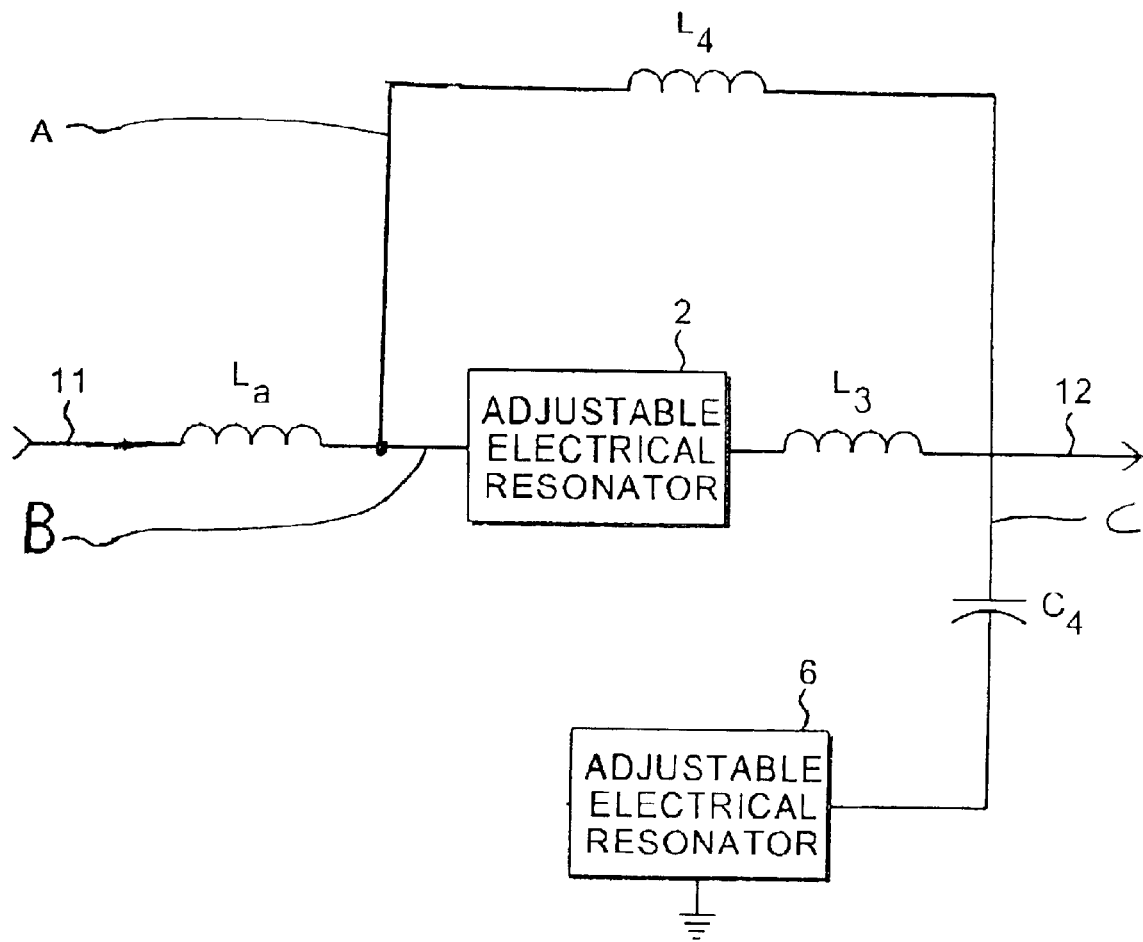
Figure 1G:
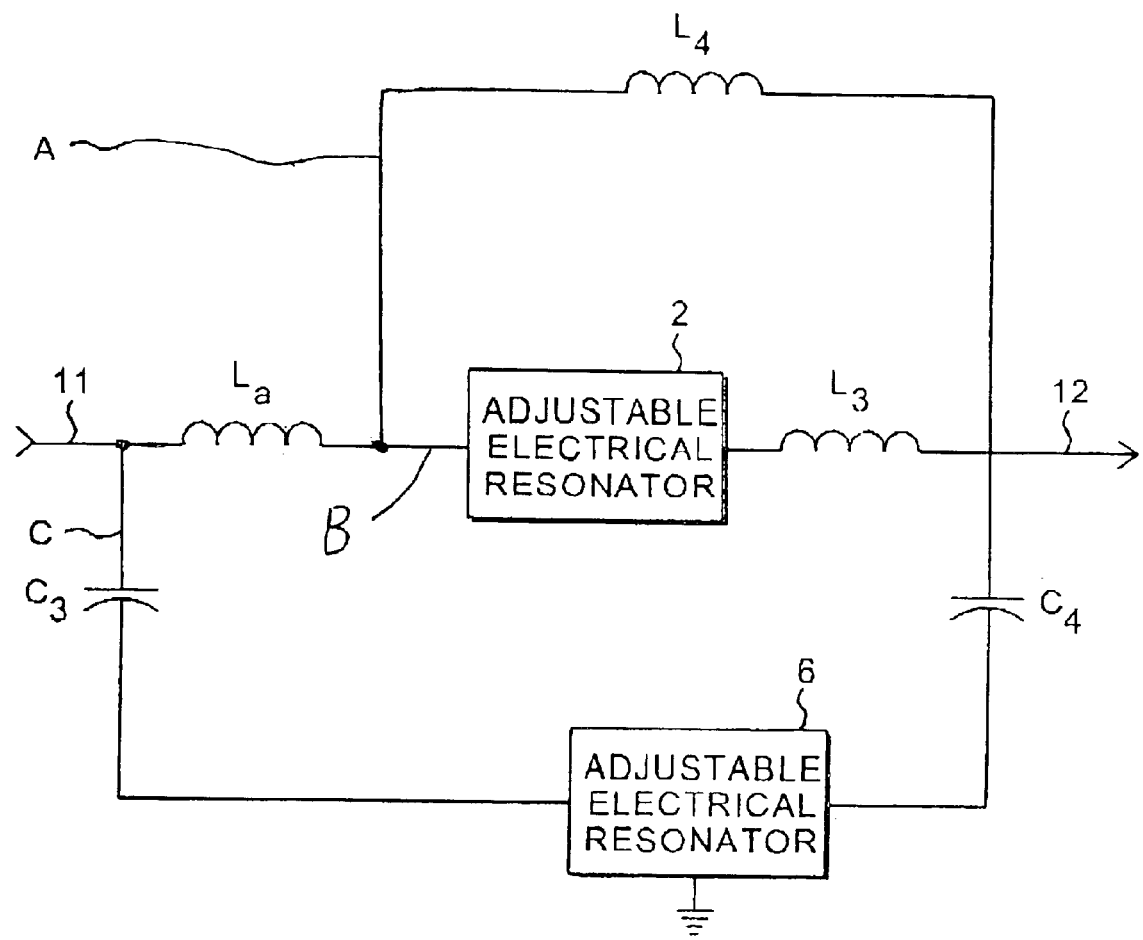
Figure 1H:
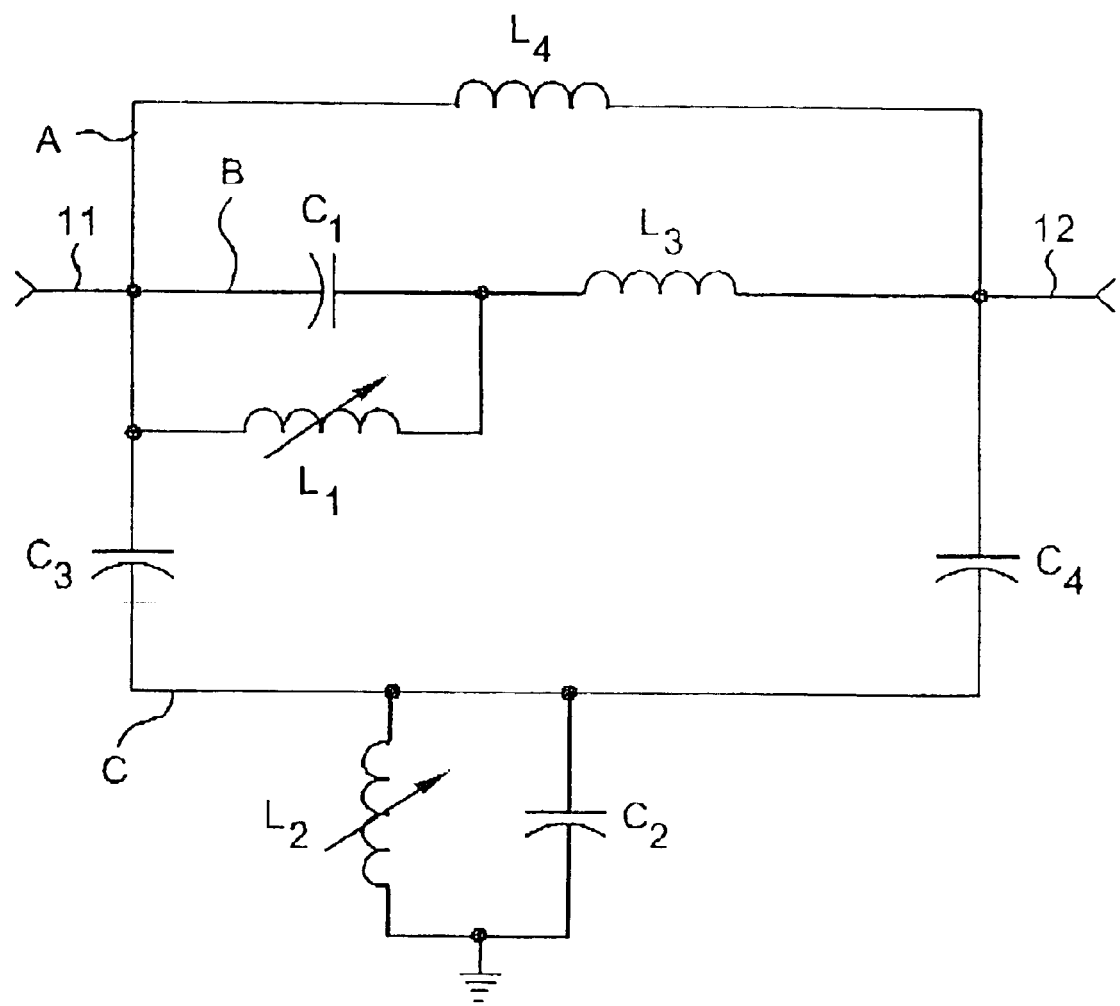
Figure 1I:
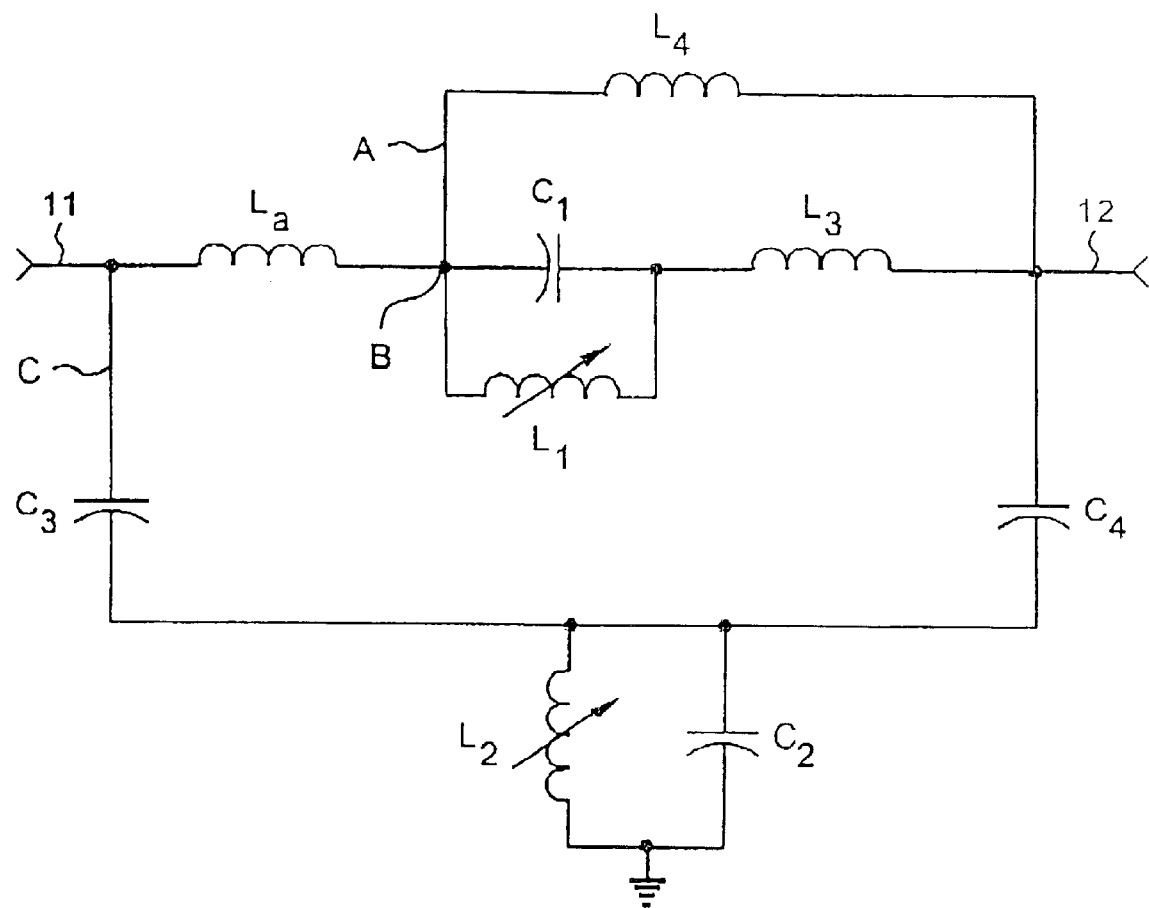

Preferably, as shown in FIGS. 1f, 1g and 1i, an impedance matching inductor La is placed in series between the input and branches A and B to advantageously reduce insertion loss and increase return loss. Branch A and branch B are connected in parallel and are arranged in series connection between the output and the impedance matching inductor La. The impedance matching inductor La is also arranged in series between the input and branches A and B.

In another preferred embodiment, Branch C comprises an adjustable electrical resonator connected to at least one of the input or the output (or both).

FIGS. 1a through 1g show that Branch C comprises an adjustable electrical resonator 6. As is well-known in the art an electrical resonator typically comprises either a series LC or parallel LC circuit. The only significant structural difference between the two circuits is that the latter is preferably grounded. Although the adjustable electrical resonator 6 can comprise any known electrical resonator, it should preferably comprise an LC parallel-resonant circuit formed by placing variable inductor L2 in parallel with capacitor C2 (FIGS. 1h–1i). Similar to the adjustable tank circuit 2, the second electrical resonator 6 may include either a variable inductor or a variable capacitor (or both) for adjusting the resonant frequency to thereby move the poles of the circuit. By adjusting the individual poles of the circuit, the center frequency of the notch may be readily tuned to a desired center frequency.

In preferred embodiments shown in FIGS. 1c, 1e, 1g, 1h and 1i, Branch C may optionally include a first capacitor C3 connected between the input 11 and the adjustable electrical resonator 6. FIGS. 1d–1i illustrate that Branch C may also include a second capacitor C4 connected between the adjustable electrical resonator 6 and the output 12.

EXAMPLES

Figure 2:
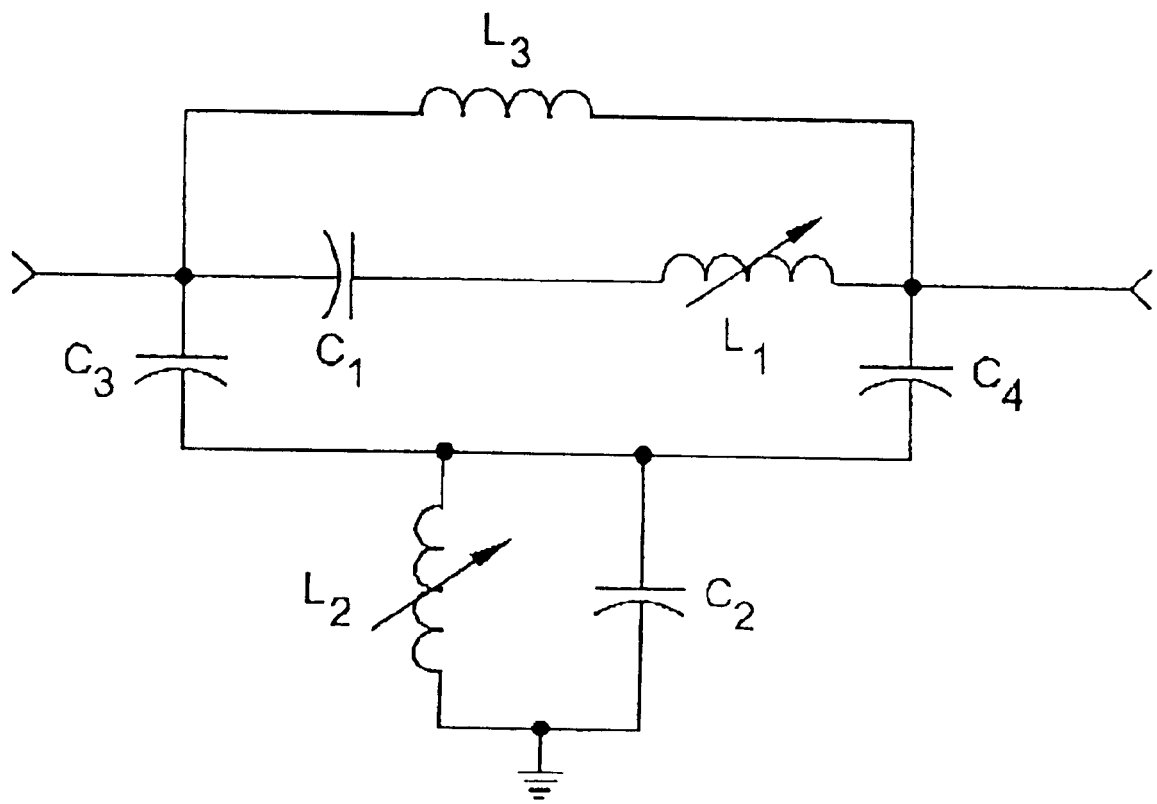
FIG. 2 is a schematic diagram of a prior art two-pole notch filter circuit.
Figure 3:
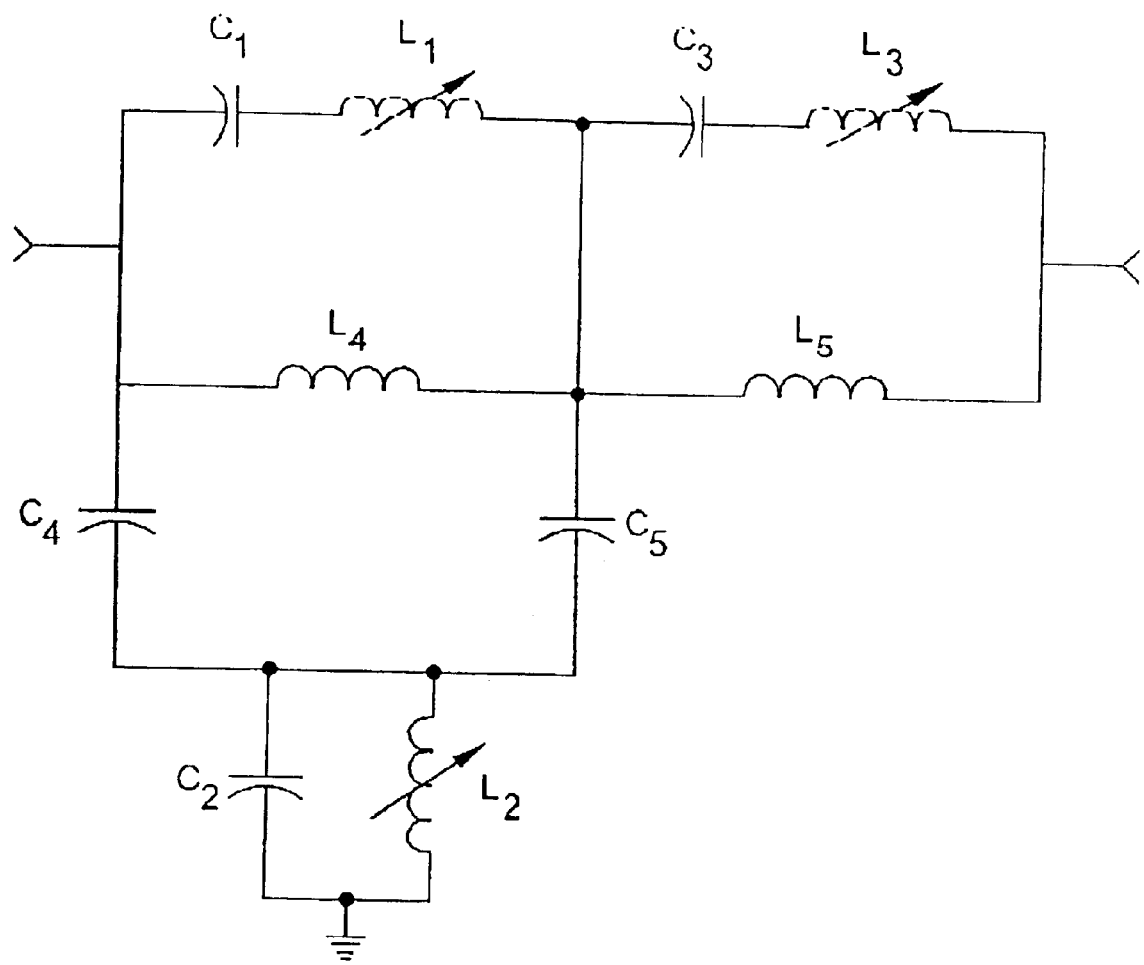
FIG. 3 is a schematic diagram of a prior art three-pole notch filter circuit.
Figure 4:
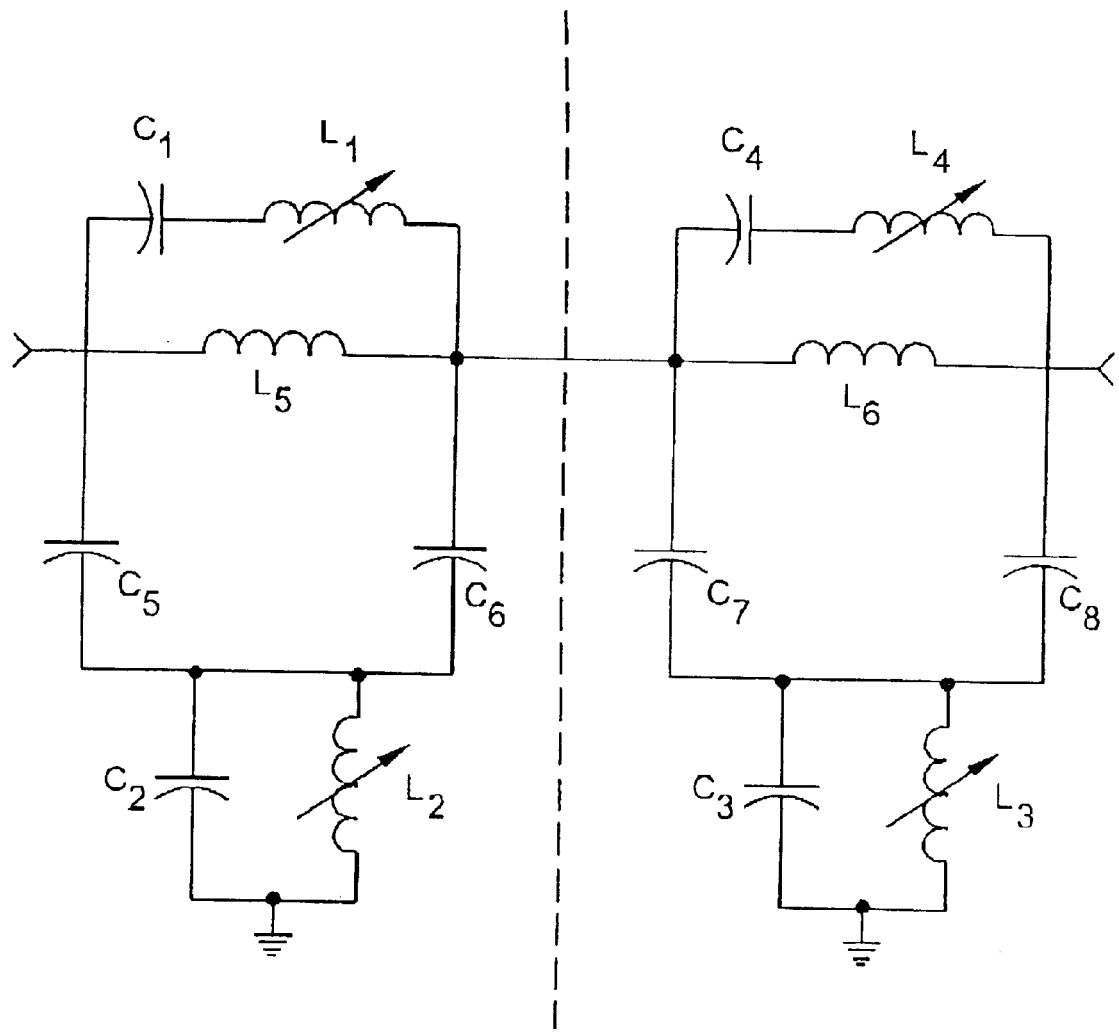
FIG. 4 is a schematic diagram of two of the prior art two-pole notch filter circuits placed in series.

A series of examples will now be described to illustrate the advantages of the present invention over known notch filters. FIGS. 5a–5d compare the frequency response of the two-pole filter of the present invention (as shown in FIG. 1h) to the frequency responses of prior art two-pole, three-pole, and four-pole notch filters, respectively (as shown in FIGS. 2, 3 and 4, respectively).

For each comparison, the preferred embodiment of the tunable two-pole passive notch filter circuit shown in FIG. 1h includes an adjustable parallel-resonant tank circuit 2 (formed by L1 and C1) arranged at an input 11, a third capacitor C3 arranged in series connection between the first adjustable parallel-resonant circuit (formed by L1 and C1) and a second adjustable parallel-resonant circuit (formed by L2 and C2) shunted to ground. A third inductor L3 is arranged between the adjustable parallel-resonant tank circuit and an output 12, and a fourth capacitor C4 is arranged in series connection between the send parallel-resonant circuit and the output 12. The adjustable parallel-resonant circuit is arranged in series between ground and the third and fourth capacitors C3 and C4. A fourth inductor L4 is arranged in series connection between the input 11 and the output 12. During each test, the components had the values shown in Table 1.

TABLE 1

| Inductor | Turns | Diameter (inches) |
|---|---|---|
| L1 | 4.5 | 0.150 |
| L2 | 2.5 | 0.150 |
| L3 | 2.5 | 0.086 |
| L4 | 3.5 | 0.063 |

| Capacitor | Capacitance (pF) | Temperature Compensation Rating |
|---|---|---|
| C1 | 10 | N80 |
| C2 | 30 | NPO |
| C3, C4 | 1 | NPO |

Example 1

Figure 5A:
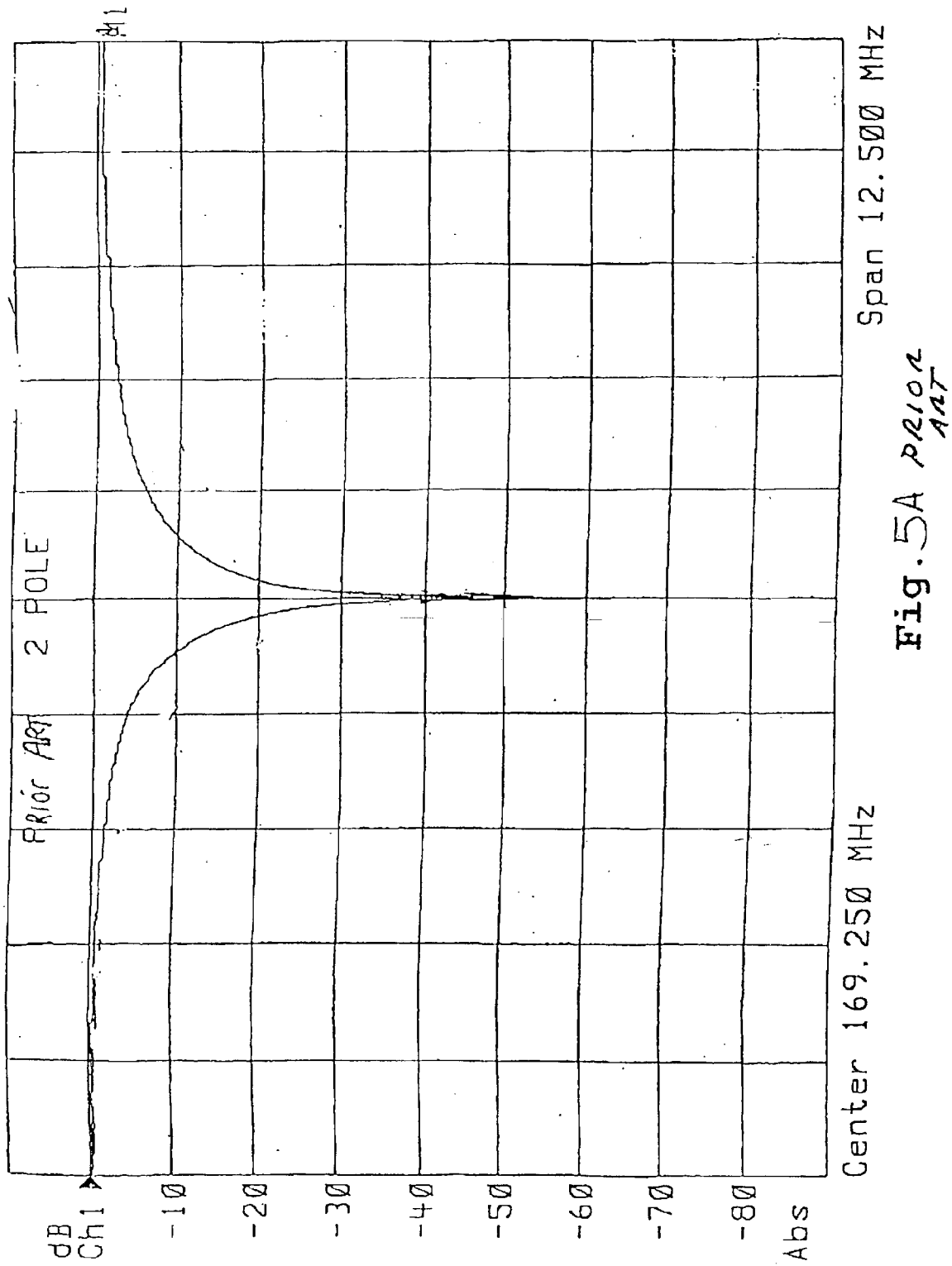
FIG. 5$a$ is a graph showing the frequency response of a prior art notch filter such as that of FIG. 2.
Figure 5B:
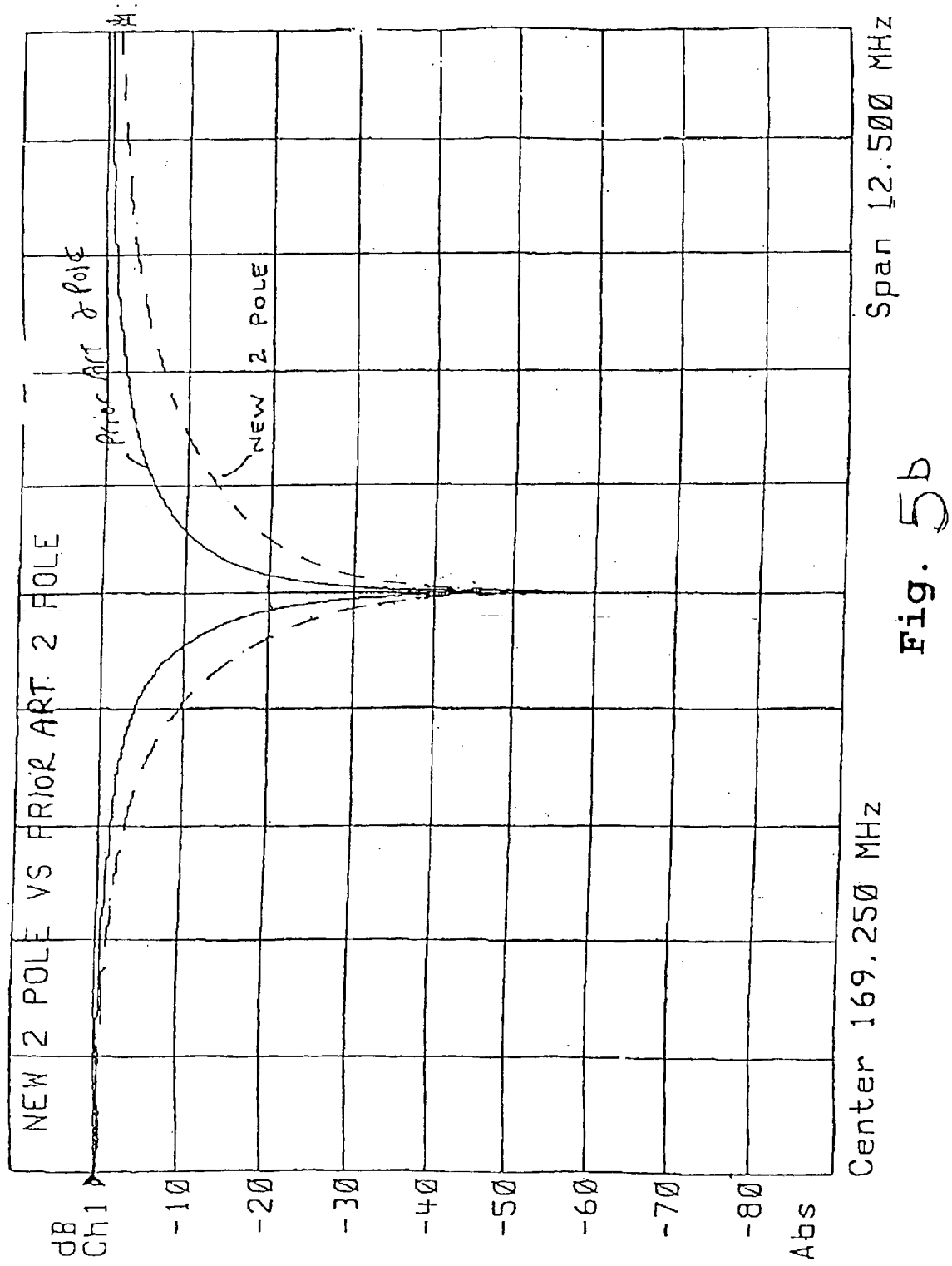

Frequency Response of a Prior Art Two-pole Filter v. Two-pole Filter of the Present Invention FIG. 5b shows a comparison in frequency responses between the two-pole prior art filter circuit illustrated in FIG. 2 and the notch filter of the present invention as shown in FIG. 1h, with each filter tuned to a center frequency of 169.250 MHZ. The component values used in constructing the prior art two-pole device are provided in Table 2 below.

TABLE 2

| Inductor | Turns | Diameter (inches) |
|---|---|---|
| L1 | 4.5 | 0.180 |
| L2 | 2.5 | 0.180 |
| L3 | 2.5 | 0.068 |

| Capacitor | Capacitance (pF) | Temperature Compensation Rating |
|---|---|---|
| C1 | 10 | N80 |
| C2 | 20 | N8O |
| C3 | 1.5 | NPO |
| C4 | 0.5 | NPO |

As illustrated in FIG. 5b, the relatively wide notch provided by the two-pole notch filter of the present invention is significantly different from the narrow notch provided by the prior art two-pole notch filter. The two-pole notch filter of the present invention exhibits a significantly wider notch shape than the extremely narrow notch characteristic associated with the prior art two-pole notch filter. This allows the two-pole notch filter of the present invention to provide much greater attenuation in the vicinity of the center frequency. As a result, when shifting of the notch occurs due to changing component values, the filter can still attenuate the desired channel band. Thus, the attenuation provided by the filter of the present invention covers a sufficient bandwidth necessary to ensure stable performance of the filter in CATV applications. In other words, the two-pole notch filter of the present invention provides much more center frequency stability than the prior art two-pole notch filters.

Example 2

Figure 5C:
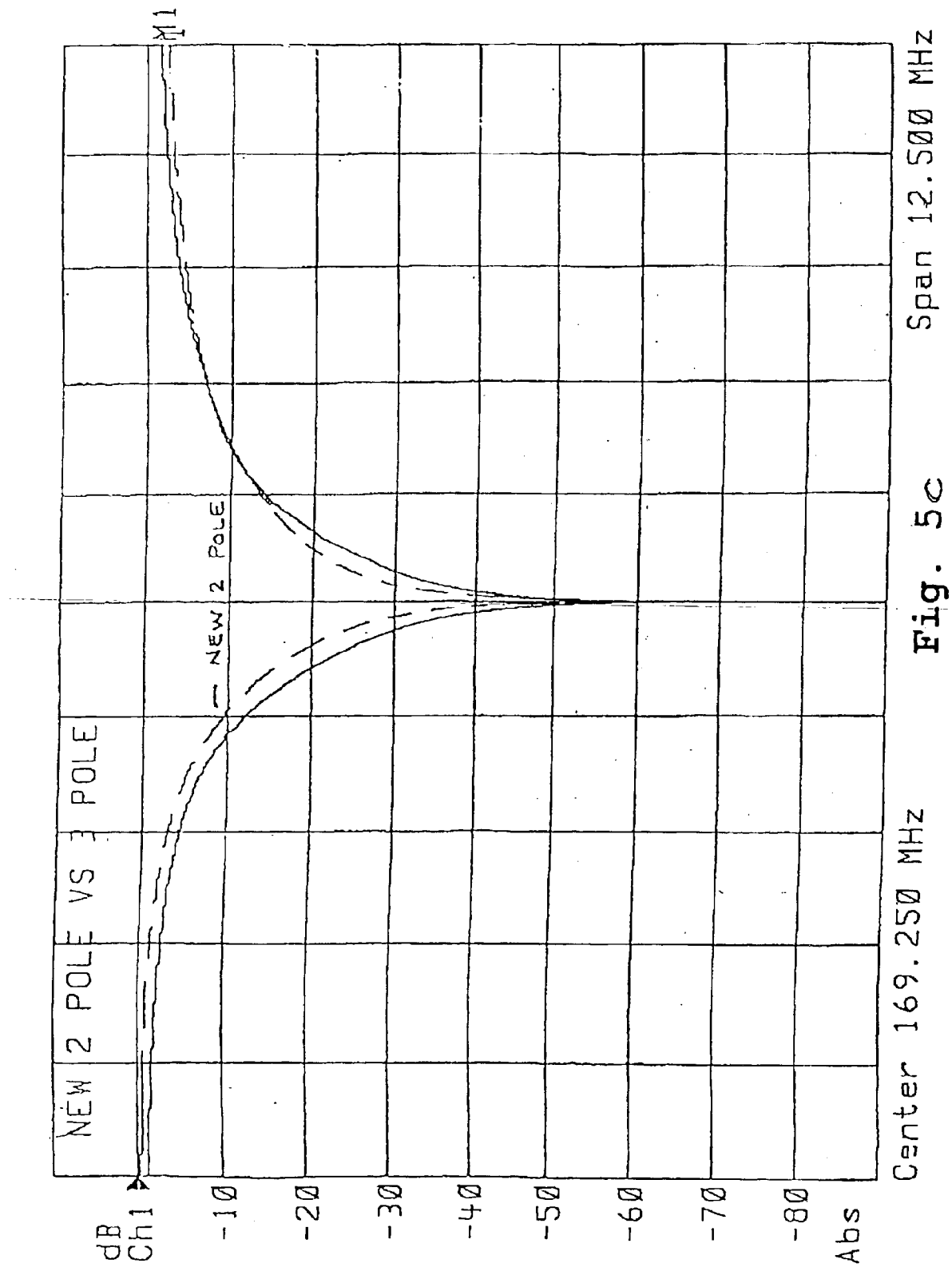

Frequency Response of a Prior Art Three-pole Notch Filter v. Two-pole Notch Filter of the Present Invention FIG. 5c shows a comparison in frequency responses between the three-pole prior art filter circuit illustrated in FIG. 3 and the notch filter of the present invention as shown in FIG. 1h, with each filter tuned to a center frequency of 169.250 MHZ. The component value used in constructing the prior art three-pole device are summarized in Table 3 below.

TABLE 3

| Inductor | Turns | Diameter (inches) |
| --- | --- | --- |
| L1, L2, L3 | 3.5 | 0.210 |
| L4 | 1.5 | 0.125 |
| L5 | 1.5 | 0.150 |

| Capacitor | Capacitance (pF) | Temperature Compensation Rating |
| --- | --- | --- |
| C1, C3 | 10 | N80 |
| C2 | 10 | N150 |
| C4, C5 | 1.8 | NPO |

FIG. 5c shows that the frequency response of the two-pole filter of the present invention is somewhat more narrow or sharp than the frequency response notch provided by an exemplary prior art three pole notch filter. Nevertheless, the two-pole notch filter still provides adequate attenuation in a sufficient bandwidth surrounding the center frequency to ensure stability. Moreover, the narrower notch shape is desirable since it prevents attenuation of residual side bands necessary for the reception of adjacent channels. In addition, the filter of the present invention is easier and less costly to manufacture since it requires less components.

Example 3

Figure 5D:
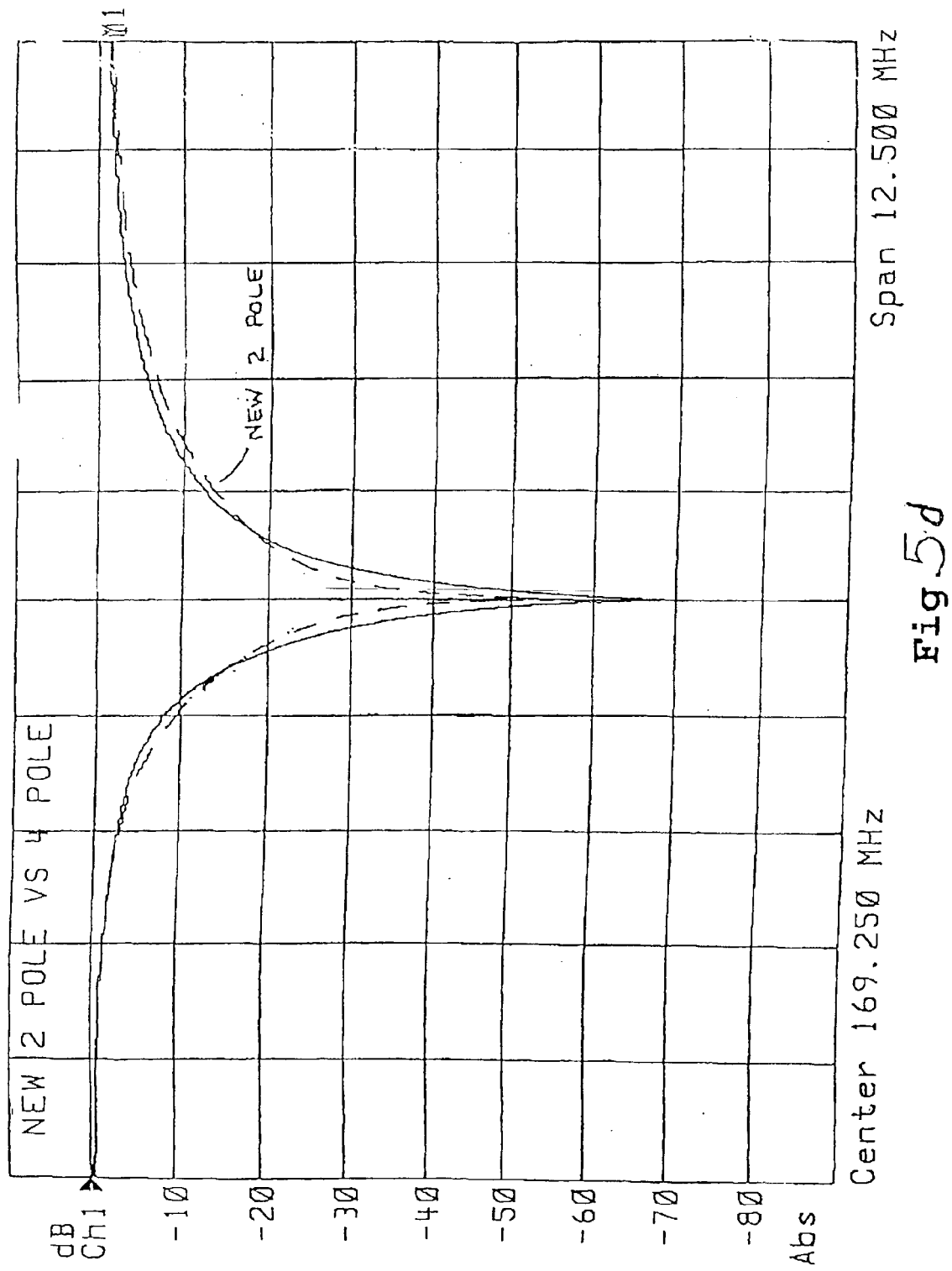

Frequency Response of a Prior Art Four-pole Filter v. Two-pole Filter of the Present Invention FIG. 5d shows a comparison in frequency responses between the four-pole prior art filter circuit illustrated in FIG. 4 the notch filter of the present invention as shown in FIG. 1h, with each filter tuned to a center frequency of 169.250 MHZ. The component values used in constructing the two prior art two-pole devices are summarized in Table 4 below.

TABLE 4

| Inductor | Turns | Diameter (inches) |
| --- | --- | --- |
| L1, L4 | 4.5 | 0.180 |
| L2, L3 | 2.5 | 0.180 |
| L5, L6 | 2.5 | 0.068 |

| Capacitor | Capacitance (pF) | Temperature Compensation Rating |
| --- | --- | --- |
| C1, C4 | 10 | N80 |
| C2, C3 | 20 | N8O |
| C5, C8 | 1.5 | NPO |
| C6, C7 | 0.5 | NPO |

FIG. 5d illustrates that the two-pole notch filter of the present invention offers performance that is virtually identical to that of the known four pole devices, but utilizes only eight passive components. The two-pole notch filter of the present invention provides comparable attenuation, bandwidth and stability in comparison to the four-pole filter, which requires fourteen passive components. Moreover, the present invention eliminates the need to use shielding between each two-pole section to prevent interfilter detuning and therefore decreases the overall size and production cost of the filter. It should also be observed that the frequency response provided by the two-pole notch filter of the present invention is at least comparable to, if not superior to, the frequency response notch provided by the much more complex and costly prior art four-pole tunable notch filter device due to the fact that the notch characteristic is narrower. Moreover, a narrower notch in the vicinity of the center frequency is advantageous since it helps prevent-attenuation of residual side bands necessary for the reception of adjacent channels.

It will be appreciated that the preferred embodiments of an advantageous tunable two-pole notch filter as illustrated in FIGS. 1a through 1i provide a compact, easily assembled, yet physically stable, device which will provide reliable notch filter performance for extended periods of time. These devices are smaller than, and less costly to manufacture and assemble than, prior art three and four-pole tunable notch filter devices. Thus, for certain applications and certain markets, these devices are much more desirable than anything currently available.

It will be appreciated by those skilled in the art that certain modifications and changes may be made to certain elements of the invention and/or types of elements used (SMD, fixed components, etc.) as disclosed herein, without departing from the scope and spirit of the invention as stated in the following claims.

What is claimed is:

1. A tunable two-pole passive notch filter circuit for attenuating select frequencies of a multi-frequency CATV signal, comprising:

an input for receiving a multi-frequency CATV signal;

an output for transmitting a portion of the multi-frequency CATV signal; and a filter network for attenuating a band of frequencies from said multi-frequency signal, said filter network comprising three branches A, B, and C, wherein branch A and branch B are connected in parallel and are arranged in series connection between the input and output, branch A comprises an inductor, branch B comprises an adjustable parallel tank circuit, and branch C comprises an adjustable electrical resonator.

2. The tunable two-pole passive notch filter circuit of claim 1, wherein said adjustable electrical resonator comprises a parallel LC circuit shunted between branch C and ground.

3. The tunable two-pole passive notch filter circuit of claim 1, wherein said branch B further comprises a stabilizing inductor connected between said adjustable tank circuit and said output.

4. The tunable two-pole passive notch filter circuit of claim 2, wherein said branch B further comprises a stabilizing inductor connected between said adjustable tank circuit and said output.

5. The tunable two-pole passive notch filter circuit of claim 1, wherein said branch C further comprises a first capacitor connected between said input and said adjustable electrical resonator.

6. The tunable two-pole passive notch filter circuit of claim 2, wherein said branch C further comprises a first capacitor connected between said input and said adjustable electrical resonator.

7. The tunable two-pole passive notch filter circuit of claim 3, wherein said branch C further comprises a first capacitor connected between said input and said adjustable electrical resonator.

8. The tunable two-pole passive notch filter circuit of claim 4, wherein said branch C further comprises a first capacitor connected between said input and said adjustable electrical resonator.

9. The tunable two-pole passive notch filter circuit of claim 1, wherein said branch C further comprises a second capacitor connected between said adjustable electrical resonator and said output.

10. The tunable two-pole passive notch filter circuit of claim 2, wherein said branch C further comprises a second capacitor connected between said adjustable electrical resonator and said output.

11. The tunable two-pole passive notch filter circuit of claim 3, wherein said branch C further comprises a second capacitor connected between said adjustable electrical resonator and said output.

12. The tunable two-pole passive notch filter circuit of claim 4, wherein said branch C further comprises a second capacitor connected between said adjustable electrical resonator and said output.

13. The tunable two-pole passive notch filter circuit of claim 5, wherein said branch C further comprises a second capacitor connected between said adjustable electrical resonator and said output.

14. The tunable two-pole passive notch filter circuit of claim 6, wherein said branch C comprises a second capacitor connected between said adjustable electrical resonator and said output.

15. The tunable two-pole passive notch filter circuit of claim 7, wherein said branch C further comprises a second capacitor connected between said adjustable electrical resonator and said output.

16. The tunable two-pole passive notch filter circuit of claim 8, wherein said branch C further comprises a second capacitor connected between said adjustable electrical resonator and said output.

17. The tunable two-pole passive notch filter circuit of claim 1, wherein said adjustable tank circuit and said adjustable electrical resonator each include a variable inductor for adjusting the resonant frequency thereof to thereby adjust the poles of said circuit.

18. The tunable two-pole passive notch filter circuit of claim 1, wherein said adjustable tank circuit and said adjustable electrical resonator each include a variable capacitor for adjusting the resonant frequency thereof to thereby adjust the poles of said circuit.

19. A tunable two-pole passive notch filter circuit for attenuating select frequencies of a multi-frequency CATV signal, comprising:
   an input for receiving a multi-frequency CATV signal;
   an output for transmitting a portion of the multi-frequency CATV signal; and
   a filter network for attenuating a band of frequencies from said multi-frequency signal, said filter network comprising three branches A, B, and C, wherein branch A comprises an inductor, branch B comprises an adjustable tank circuit, and branch C comprises an adjustable electrical resonator connected to at least one of the input or the output, and wherein branch A and branch B are connected in parallel and are arranged in series connection bete the output and a second inductor, said second inductor arranged in series between the input and branches A and B.

20. The tunable two-pole passive notch filter circuit of claim 19, wherein said adjustable electrical resonator comprises a parallel LC circuit shunted between Branch C to ground.

21. The tunable two-pole passive notch filter circuit of claim 19, wherein said branch B further comprises a stabilizing inductor connected between said adjustable tank circuit and said output.

22. The tunable two-pole passive notch filter circuit of claim 20, wherein said branch B comprises a stabilizing inductor connected between said adjustable tank circuit and said output.

23. The tunable two-pole passive notch filter circuit of claim 19, wherein said branch C further comprises a first capacitor connected between said input and said adjustable electrical resonator.

24. The tunable two-pole passive notch filter circuit of claim 20, wherein said branch C further comprises a first capacitor connected between said input and said adjustable electrical resonator.

25. The two-pole passive notch filter circuit of claim 21, wherein said branch C comprises a first capacitor connected between said input and said adjustable electrical resonator.

26. The tunable two-pole passive notch filter circuit of claim 22, wherein said branch C further comprises a first capacitor connected between said input and said adjustable electrical resonator.

27. The tunable two-pole passive notch filter circuit of claim 23, wherein said branch C further comprises a second capacitor connected between said adjustable electrical resonator and said output.

28. The tunable two-pole passive notch filter circuit of claim 24, wherein said branch C further comprises a second capacitor connected between said adjustable electrical resonator and said output.

29. The tunable two-pole passive notch filter circuit of claim 25, wherein said branch C further comprises a second capacitor connected between said adjustable electrical resonator and said output.

30. The tunable two-pole passive notch filter circuit of claim 26, wherein said branch C further comprises a second capacitor connected between said adjustable electrical resonator and said output.

31. The tunable two-pole passive notch filter circuit of claim 19, wherein said adjustable tank it and said adjustable electrical resonator each include a variable inductor for adjusting the resonant frequency thereof to thereby adjust the poles of said circuit.

32. The tunable two-pole passive notch filter circuit of claim 19, wherein said adjustable tank circuit and said adjustable electrical resonator each include a variable capacitor for adjusting the resonant frequency thereof to thereby adjust the poles of said circuit.

33. A tunable two-pole passive notch filter circuit, comprising:
   an input;
   an output;
   an adjustable tank circuit arranged in series connection between said input and said output;
   a fourth inductor ranged in parallel with said adjustable tank circuit, and in series connection between said input and said output; and
   an adjustable resonant circuit arranged in series correction between said input and said output.

34. The tunable two-pole passive notch filter circuit of claim 33, further comprising a third inductor arranged in series connection between said adjustable tank circuit and said output.

35. The tunable two-pole passive notch filter circuit of claim 34, further comprising a fifth inductor arranged in series connection between said input and said adjustable tank circuit.

36. The tunable two-pole passive notch filter circuit of claim 35, further comprising a third capacitor arranged in series connection between said input and said adjustable resonant circuit and a fourth capacitor arranged in series connection between said adjustable resonant circuit and said output.

37. The tunable two-pole passive notch filter circuit of claim 36, wherein said adjustable resonant at is shunted between ground and said third and fourth capacitors.

* * * * *